United States Patent [19]

Banning

[11] 4,019,162

[45] Apr. 19, 1977

[54] COAXIAL TRANSMISSION LINE WITH REFLECTION COMPENSATION

[75] Inventor: Harmon W. Banning, Derwood, Md.

[73] Assignee: Weinschel Engineering Company, Gaithersburg, Md.

[22] Filed: Aug. 11, 1975

[21] Appl. No.: 603,703

[52] U.S. Cl. .................................. 333/96; 333/33; 333/97 R

[51] Int. Cl.$^2$ ...................... H01P 3/06; H01P 5/04; G01R 25/02

[58] Field of Search ........... 333/97, 96, 33; 174/28, 174/102; 324/95

[56] References Cited

UNITED STATES PATENTS

| | | | |
|---|---|---|---|
| 2,589,328 | 3/1952 | Bondon | 333/96 |
| 3,151,925 | 10/1964 | Bondon | 333/96 |

FOREIGN PATENTS OR APPLICATIONS

| | | | |
|---|---|---|---|
| 596,981 | 4/1960 | Canada | 333/96 |
| 527,956 | 6/1956 | Germany | 333/97 |

*Primary Examiner*—Alfred E. Smith
*Assistant Examiner*—Marvin Nussbaum
*Attorney, Agent, or Firm*—William D. Hall; Geoffrey R. Myers

[57] ABSTRACT

A coaxial transmission line for u.h.f. waves, and particularly for use with slotted line equipment, in which the center conductor is supported coaxially within the outer conductor by spaced dielectric pins extending radially between said conductors, wherein wave reflections are minimized by means of counter-bored areas in the form of shallow depressions in the surface of the inner conductor where it is engaged by said pins, said depressions completely surrounding the point of engagement of each pin with said inner conductor and being dimensioned to produce an inductive effect to compensate for the capacitive effect of the dielectric pins.

17 Claims, 8 Drawing Figures

COAXIAL TRANSMISSION LINE WITH REFLECTION COMPENSATION

BACKGROUND OF THE INVENTION

It is well known that a coaxial transmission line with a movable probe may be used as a component of an overall apparatus for measuring the impedance of a load. The present invention relates to this form of coaxial transmission line.

A coaxial transmission line must, of course, have suitable supporting means for supporting the inner conductor. The supporting means may take the form of spaced supports such as beads, or dielectric pins. At points close to the generator end of the transmission line reflection from the supporting means is not a serious problem but at points further along the line toward the other end, the supportng means becomes of primarily importance because reflections from said supports are directly additive, in vectorial fashion, to the waves that are intended to be measured. Groups of radially disposed pins are often used as the supporting means, in which case all of the pins of a given group are located in a single plane perpendicular to the inner conductor, the groups being spaced apart in order to support the inner conductor along its entire length. To avoid reflections from a dielectric pin, various prior art techniques have been used. For example, holes may be drilled in the inner conductor, longitudinally forward of and/or rearward to the pin, while maintaining a certain distance from the pin, to provide inductive reactance opposing the capacitive reactance of the pin (see U.S. Pat. No. 2,796,589). Alternatively, one or more circumferential grooves spaced longitudinally ahead of and/or behind the pin have been used, the grooves however being spaced from the pin. It has also been proposed to have cavities entirely enclosed within the inner conductor which are longitudinally ahead of, as well as behind, a group of pins, to provide the necessary compensation (see Bondon U.S. Pat. No. 3,151,925 entitled "COAXIAL TRANSMISSION LINE UTILIZING REACTANCE COMPENSATED, PAIRED PIN-TYPE INSULATOR SPACING ASSEMBLY", dated Oct. 6, 1964; and Bondon U.S. Pat. No. 2,589,328 entitled "COAXIAL TRANSMISSION LINE SPACING ASSEMBLY", dated March 18, 1952).

All of the above arrangements for compensating for the capacitive effect of the dielectric pin have their drawbacks, including manufacturing problems, and this is especially true as the coaxial transmission lines are made in small sizes so as to be suitable for use at frequencies up to as high as 40 GHz.

It is, therefore, an object of this invention to provide improved compensation for the capacitive effect of a dielectric pin used to support the inner conductor of a transmission line.

It is a further object of the invention to provide a coaxial transmission line suitable for use at frequencies up to 40 GHz.

An additional object is to provide a coaxial transmission line which may be easily assembled.

It is also an object of the invention to provide a coaxial transmission line that may be manufactured at low cost.

It is still another object of the invention to provide a slotted transmission line with a probe, suitable for measuring the impedance of a load, which may efficiently operate at frequencies up to as high as 40 GHz and yet be capable of manufacture at low cost.

SUMMARY OF THE INVENTION

This invention relates to a coaxial transmission line with a probe movable along the line to enable measurement of the impedance of a load, particularly at frequencies up to 40 GHz, although in its broader aspects the invention is not limited to any particular frequency range or to a coaxial line with a probe for measuring impedance of a load.

According to the present invention, the problem is solved by reducing the distance between the pin and the compensating hole to zero. This can be accomplished by counterboring the surface of the inner conductor so as to leave a shallow depression around the pin location. This depression is dimensioned to provide the desired compensating effect, and in practice it has been found possible to greatly reduce the SWR, in some cases to less than one-third of the best previously obtainable value. Furthermore, it is much easier to do, since the bores, which must in any case be provided to receive the pin ends, can now be used to accurately and easily center the counterbore drill, and as this is a larger drill, it has less tendency to break. Also, only one hole is bored at each pin location. Furthermore, instead of having the three (more or less) supporting pins in the same transverse plane, they are spaced from each other longitudinally.

The specific nature of the invention, as well as other objects and advantages thereof will clearly appear from a description of a preferred embodiment as shown in the accompanying drawing, in which:

DETAILED DESCRIPTION OF THE INVENTION

Figure 1:
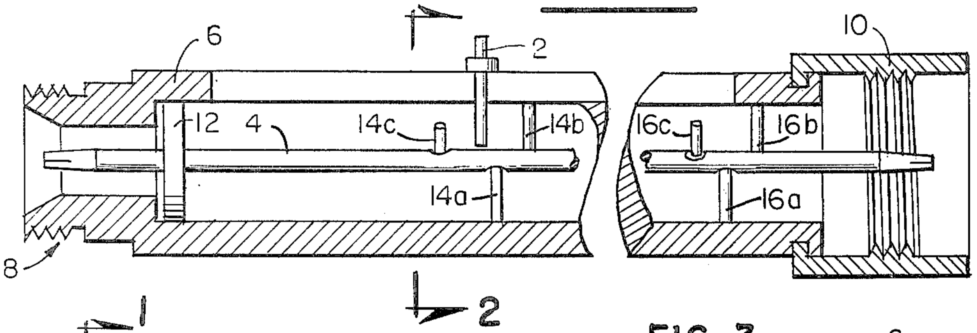
FIG. 1 is a longitudinal sectional view of the invention as applied to a typical slotted line, the view being taken on line 1—1 of FIG. 2.
Figure 2:
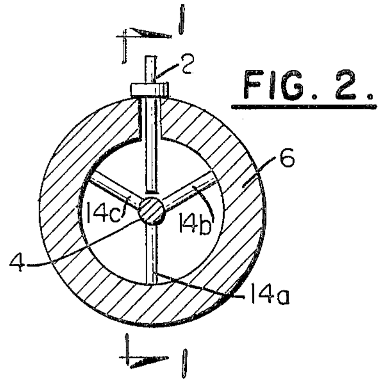
FIG. 2 is a sectional view taken on line 2—2 of FIG. 1.

Referring to FIG. 1, the invention is shown schematically as applied to a typical slotted line section having a probe 2 which can be slid along the length of the slotted line, the probe end terminating close to a center conductor 4 which is retained within the cylindrical bore of a grounded outer conductor 6 having the usual connector ends 8 and 10. The center conductor 4 is retained at the input end by any conventional means such as an insulating disc 12, since the supporting means at this end is not critial as explained above. Along its length, the center conductor is held in place by means of one or more sets of insulating pins 14*a*, *b* and *c*, and 16*a*, *b* and *c*, which are rigidly fastened to the center conductor at one end, as will be explained in more detail below, while at the other end they merely abut the inner surface of the outer conductor. The supporting pins are preferably provided in sets of three as shown at each support location, as best seen in FIG. 2.

Figure 3:
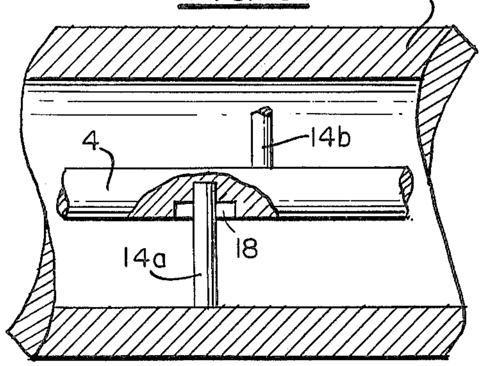
FIG. 3 is an enlarged view of the center section of FIG. 1 showing the pin support in more detail.

In FIG. 3, the center conductor is partly broken away in order to show in detail the manner in which the supporting pin 14*a* is attached thereto. The center conductor is drilled to provide a small hole which can snugly receive the end of pin 14*a* with a force fit, and a shallow circular depression 18 is then counterbored concentrically with this hole so as to provide a shallow depression surrounding the pin 14*a* at the point where it engages the center conductor.

Figure 7:
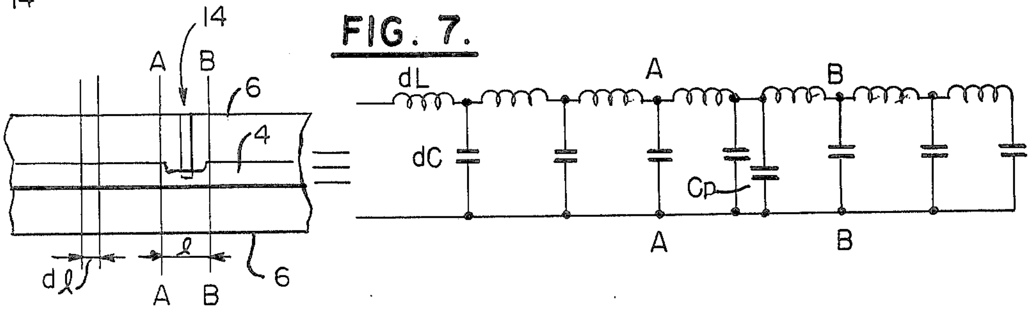

The electrical principle employed as a basis of compensation is explained with reference to FIG. 7 which $$\sqrt{\frac{L}{C+C_P}} = Z_0 = \sqrt{\frac{l \cdot Z}{C} \cdot \frac{cZ}{l\left(1+\frac{C_p \cdot C \cdot Z}{l}\right)}} \tag{4}$$

where $Z$ = characteristic impedance of the line between 'A and B l = length of the line section A to B. The equivalent circuit of this line section is a low pass filter with the cut-off frequency in terms of $C_{tot}$ capacitance of the section is given by;

$$\omega_g = \frac{1}{\sqrt{\frac{L}{2} \cdot \frac{C_{tot}}{2}}} = \frac{Z}{\sqrt{\frac{l \cdot Z}{c} \cdot \frac{l}{c \cdot Z}\left(1+\frac{C_p \cdot C \cdot Z}{l}\right)}} = \frac{Z \cdot C}{l\sqrt{1+\frac{C_p \cdot c \cdot Z}{l}}} \tag{5}$$

shows at the left side a section of the coaxial conductor with a pin 14, which may be any pin of the type shown above, while on the right hand side of the Figure, the electrical equivalent of the distributed impedance is schematically shown by conventional symbols. The cross-section of the line to the left of the plane A—A and to the right of plane B—B represents the unsupported section of the line, and is such that the ratio of the inductance and capacitance of a piece of length *dl* is $$Z_0 = \frac{dL}{dC} \tag{1}$$

which is the characteristic impedance of the line.

where

*d*L is the inductance per unit length of the coaxial line

*d*C is the capacitance per unit length of the coaxial line.

The support portion, that is the section between planes A—A and B—B adds capacitance to the line $C_p$. Therefore the relation of (1) is not obtained in the section between planes A—A and B—B, but can be achieved by adding inductance in the right amount so as to obtain the overall ratio $$Z_0 = \sqrt{\frac{dL}{dC}}.$$

The distributed inductance of a length of transmission line which is short in comparison to a wavelength is $$L = 1 \times Z/c \tag{2}$$

where

1 = length $Z$ = characteristic impedance $c$ = transmission speed (speed of light in an air filled line). Similarly, the distributed capacitance is $$C = 1/c \times Z.$$

The total capacitance of the section from plane A—A to plane B—B is then $C_{tot} = C + C_p$ where $C_p$ = capacitance of the dielectric pin. Compensation of the pin capacitance is achieved when The characteristic impedance of a low pass filter is frequency dependent and is given by $$Z_l = Z\sqrt{1-\left(\frac{\omega}{\omega_g}\right)^2} \tag{6}$$

It is therefore necessary to achieve a cut-off frequency much higher than the highest operational frequency in order to obtain only a small tolerable deviation from the required characteristic impedance $Z_O$. It can be seen from equations (5) and (6) that for a deviation of $Z_1$ by 0.5% the operational frequency has to be less than 0.10Wg, and from equation (5) that the maximum length has to be less than $$l = \frac{2c}{\omega_g\sqrt{1+\frac{C_p \cdot c \cdot Z}{l}}} = \frac{2c}{10\omega\sqrt{1+\frac{C_p}{C}}} \tag{7}$$

The present construction is designed to provide the minimum possible length of section A–B, since the compensating section and the construction shown in FIGS. 1–3 is made as short as possible by completely surrounding and including the supporting pin.

Figure 4:
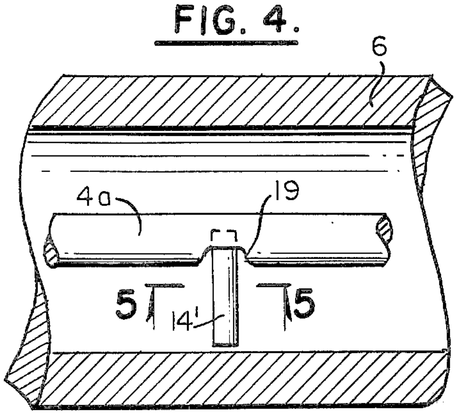
FIG. 4 is a view similar to FIG. 3, showing an alternative form of the invention.
Figure 5:
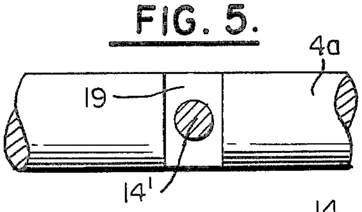
FIG. 5 is a sectional view taken on line 5—5 of the center conductor shown in FIG. 4.
Figure 8:
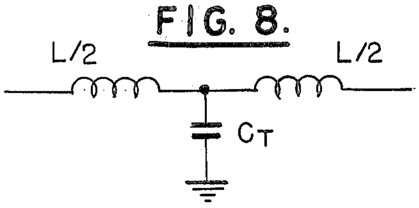
FIGS. 7 and 8 are schematic diagrams used in explaining the principle of the invention.

FIGS. 4 and 5 show an alternative construction in which the compensating depression is formed not by counterboring with a larger size drill, but simply by filing or gouging out small section 19 around the base of pin 14'. The principle in this case is the same, since the longitudinal dimension of the shallow depression is what is important as can be seen from the preceding analysis.

Figure 6:
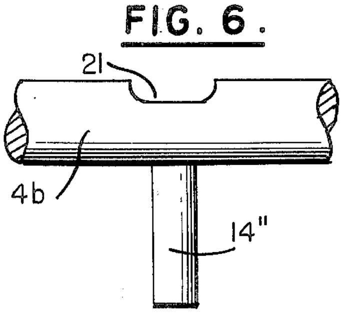
FIG. 6 is a view of a center conductor showing a modified form of the invention.

FIG. 6 shows still another form of construction whereby a depression 21 is formed on the opposite side of the center connector 4*b* from pin 14''. The important thing is that the effective compensating will occur in the correct region along the length of the insulating pin 14''.

I claim:

1. a. A coaxial transmission line comprising b. a rigid hollow outer conductor, c. a rigid inner conductor centrally located within the hollow outer conductor, said inner conductor having an outer surface, d. support means for rigidly supporting the inner conductor within the outer conductor comprising spaced dielectric pins extending radially between said conductors and which separately engage said inner conductor, and e. means for reducing wave reflections of at least one of said pins comprising a depressed area, in said outer surface, of said inner conductor, said depressed area being located in the same lateral plane of the inner conductor as said one pin and constituting a shallow depression in the outer surface of the inner conductor and extending longitudinally along said inner conductor, said depressed area extending laterally away from the pin for a distance which is small as compared to the periphery of the inner conductor and being dimensioned to produce an inductive effect tending to compensate for the capacitive effect of the dielectric pin.

2. The invention according to claim 1, one end of said one pin being fixed to said inner conductor, and said shallow surface depression being immediately adjacent to and including said one end of the pin which is fixed to the center conductor and extending longitudinally along said inner conductor for a distance coextensive with but greater than the area of engagement of said inner conductor with said dielectric pin.

3. The invention according to claim 2, said depressed surface area being a counter-bored area surrounding said one end of the pin.

4. The invention according to claim 1, said shallow surface depression being on the other side of said conductor from its complementary pin.

5. A coaxial transmission line as defined in claim 1, in which said supporting means comprises groups of pins for supporting the inner conductor, said groups being spaced longitudinally along the transmission line, at least two of the pins of at least one of said groups being spaced longitudinally along the transmission line from each other.

6. A coaxial transmission line as defined in claim 1, in which said supporting means comprises groups of dielectric pins for supporting the inner conductor, said groups being spaced longitudinally along the transmission line, at least two of the pins of one of said groups being spaced longitudinally along the transmission line from each other but at distances from each other that are small as compared to the distance between adjacent groups, each pin having its individual surface depression immediately surrounding the pin and in the inner conductor for producing an inductive effect to compensate for the capacitive effect of the dielectric pin.

7. A coaxial transmission line as defined in claim 6 in which the inner surface of the outer conductor and the outer surface of the inner conductor are circular and have a common center line running through the middle of the inner conductor and in which the outer conductor has a longitudinal slot and a measuring probe extending through the slot and movable along the coaxial transmission line, each of said two pins having its individual surface depression of such limited lateral width that no part of either depression extends into alignment with said probe.

8. A coaxial transmission line as defined in claim 1, in which said supporting means comprises groups of pins for supporting the inner conductor, said groups being spaced longitudinally along the transmission line, all of the pins of one of said groups being spaced longitudinally along the transmission line from each other, each pin having its individual surface depression immediately surrounding the pin and in the inner conductor for producing an inductive effect to compensate for the capacitive effect of the dielectric pin.

9. a coaxial transmission line as defined in claim 1, in which said supporting means comprises groups of pins for supporting the inner conductor, said groups being spaced longitudinally along the transmission line, all of the pins of one of said groups being spaced longitudinally along the transmission line from each other but at distances from each other that are small as compared to the distance between adjacent groups, each pin having its individual surface depression immediately surrounding the pin and in the inner conductor for producing an inductive effect to compensate for the capacitive effect of the dielectric pin.

10. A coaxial transmission line as defined in claim 1, in which said suporting means comprises groups of pins for supporting the inner conductor, said groups being spaced longitudinally along the transmission line, all of the pins of all of said groups being spaced longitudinally along the transmission line from each other, each pin having its individual surface depression immediately surrounding the pin and in the inner conductor for producing an inductive effect to compensate for the capacitive effect of the dielectric pin.

11. A coaxial transmission line as defined in claim 1, in which said supporting means comprises dielectric pins, spaced longitudinally along the transmission line, for supporting the inner conductor, each pin having its individual surface depression immediately surrounding the pin and in the inner conductor for producing an inductive effect to compensate for the capacitive effect of the dielectric pin.

12. A coaxial transmission line as defined in claim 1 in which the outer conductor has a longitudinal slot through the same, and a radial probe extending through the slot and movable along the length of the transmission line, said support means comprising at least two pins extending between the inner and outer conductors at different angular positions, each of said two pins having its own individual surface depression of such limited lateral width that no part of it extends into alignment with said radial probe, said probe passing midway between the said angular positions of said two pins.

13. A coaxial transmission line for UHF up to 40 GHz comprising b. a rigid hollow outer conductor, c. a rigid inner conductor centrally located within the hollow outer conductor, d. support means for rigidly supporting the inner conductor within the outer conductor comprising spaced dielectric pins extending radially between said conductors, each of said pins being fixed at one end of the inner conductor, e. means for reducing wave reflections of each said pin comprising a depressed surface area of said inner conductor, said depressed area being a single shallow surface depression on the center conductor extending longitudinally along said center conductor for a distance coextensive with but greater than the area of engagement of said center conductor with said dielectric pin, said depressed area being dimensioned to produce an inductive effect tending to compensate for the capacitive effect of the dielectric pin, and f. said shallow surface depression being on the other side of said conductor from said pin.

14. a coaxial transmission line comprising a. a rigid hollow outer conductor, b. a rigid inner conductor centrally located within the hollow outer conductor, c. support means for rigidly supporting the inner conductor within the outer conductor comprising groups of dielectric pins with the pins of each group extending in different radial planes between said conductors, at least two pins of each group being spaced from each other longitudinally along the inner conductor, with any spacing between pins of a group being small as compared to the spacing between groups, and d. means for reducing wave reflections of at least two of said spaced pins comprising an individual inductive cavity for each pin and through which the pin passes, each cavity being dimensioned to produce an inductive effect tending to compensate for the capacitive effect of the dielectric pin passing through the cavity.

15. A coaxial transmission line as defined in claim 14 in which the outer conductor has a longitudinal slot through the same, and a radial probe extending through the slot and movable along the length of the transmission line, said support means comprising at least two pins extending between the inner and outer conductors at different angular positions, the inductive cavities for each of said two pins being of such limited lateral width that no part thereof extends into alighment with said probe, said probe passing midway between said angular positions of said two pins.

16. A coaxial transmission line comprising a. a rigid hollow outer conductor, b. a rigid inner conductor centrally located c. said conductors comprising a transmission line having an inlet end, d. support means for rigidly supporting the inner conductor within the outer conductor comprising at least a plurality of dielectric pins remote from said inlet end and extending radially between said conductors with all of the said pins being spaced from each other longitudinally along the line and e. means for reducing wave reflections of said pins comprising an individual inductive cavity in the inner conductor for each pin and through which the pin passes, each said cavity being dimensioned to produce an inductive effect tending to compensate for the capacitive effect of the dielectric pin which passes through it.

17. A coaxial transmission line as defined in claim 16 in which the outer conductor has a longitudinal slot through the same, and a probe extending through the slot and movable along the length of the transmission line, said support means comprising at least two pins extending between the inner and outer conductors at different angular positions, the inductive cavities for each of said two pins being of such limited lateral width that no part thereof extends into alignment with said probe, said probe passing midway between said angular positions of said two pins.

* * * * *